(12) United States Patent  
Barnes

(10) Patent No.: US 9,338,039 B1
(45) Date of Patent: May 10, 2016

(54) EFFICIENT SIGNAL CLASSIFICATION IN DIGITAL PRE-DISTORTION SYSTEMS

(71) Applicant: Xilinx, Inc., San Jose, CA (US)

(72) Inventor: Vincent C. Barnes, El Paso, TX (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/836,541

(22) Filed: Aug. 26, 2015

(51) Int. Cl.
  H04L 25/49 (2006.01)
  H04L 25/08 (2006.01)
  H03F 3/21 (2006.01)
  H04L 27/36 (2006.01)
  H03F 1/32 (2006.01)

(52) U.S. Cl.
  CPC .............. *H04L 25/08* (2013.01); *H03F 1/3241* (2013.01); *H03F 1/3247* (2013.01); *H03F 3/21* (2013.01); *H04L 27/367* (2013.01)

(58) Field of Classification Search
  CPC ..... H04L 25/08; H04L 27/368; H04L 27/367; H03L 3/21; H03L 1/3241; H03L 1/3247
  USPC .......... 375/285, 295, 296; 332/106, 107, 117, 332/123, 149
  See application file for complete search history.

(56) References Cited

U.S. PATENT DOCUMENTS

| 5,920,808 | A | * | 7/1999 | Jones .................... H03F 1/3247 455/126 |
|---|---|---|---|---|
| 7,313,373 | B1 | | 12/2007 | Laskharian et al. |
| 7,737,779 | B2 | | 6/2010 | Summerfield et al. |
| 7,741,906 | B1 | | 6/2010 | Summerfield |
| 7,746,167 | B1 | | 6/2010 | Summerfield |
| 8,229,025 | B1 | | 7/2012 | Summerfield |
| 8,243,852 | B1 | | 8/2012 | Summerfield |
| 8,285,770 | B1 | | 10/2012 | Barnes et al. |
| 8,666,336 | B1 | | 3/2014 | Dick |
| 8,737,523 | B2 | | 5/2014 | Barnes |
| 8,837,633 | B2 | | 9/2014 | Dick |
| 8,913,692 | B1 | | 12/2014 | Copeland |
| 9,008,156 | B1 | | 4/2015 | Dick |
| 9,014,241 | B2 | | 4/2015 | Dick |
| 9,014,319 | B1 | | 4/2015 | Copeland |
| 9,172,409 | B2 | | 10/2015 | Copeland |
| 9,189,458 | B1 | | 11/2015 | Langer et al. |
| 2010/0052780 | A1 | | 3/2010 | Summerfield et al. |
| 2010/0308910 | A1 | | 12/2010 | Barnes |
| 2014/0133527 | A1 | | 5/2014 | Dick |

\* cited by examiner

*Primary Examiner* — Tesfaldet Bocure

(74) *Attorney, Agent, or Firm* — Robert M. Brush

(57) ABSTRACT

In an example, an apparatus for signal classification in a digital pre-distortion (DPD) system includes a positive frequency path including a first half-band low pass filter (LPF) operable to filter samples of an input digital samples after positive frequency translation; a negative frequency path including a second half-band LPF operable to filter the samples of the input digital samples after negative frequency translation; a power estimation circuit coupled to the positive frequency path and the negative frequency path, the power estimation circuit operable to determine a first average power based on output of the first half-band LPF, a second average power based on output of the second half-band LPF, and a total average power of the input digital samples; and a controller operable to determine a frequency content metric from the first average power and the second average power, and to select a set of filter coefficients for the DPD system based on the frequency content metric and the total average power.

20 Claims, 8 Drawing Sheets

US 9,338,039 B1

EFFICIENT SIGNAL CLASSIFICATION IN DIGITAL PRE-DISTORTION SYSTEMS

TECHNICAL FIELD

Examples of the present disclosure generally relate to electronic circuits and, in particular, to efficient signal classification in digital pre-distortion systems.

BACKGROUND

Digital pre-distortion (DPD) can be used to enhance linearity of output of a power amplifier. Modern DPD systems employ frequency selective non-linear filters. The optimal filter is a function of the power amplifier being pre-distorted, as well as the input power and frequency content of the signal being passed through the power amplifier. Filter coefficients are set based on the input power and frequency content of the input signal. The frequency and/or input power, however, can vary over time. As frequency and/or power of the input signal varies, a given set of filter coefficients for the DPD system becomes less optimal, leading to less optimal digital pre-distortion.

SUMMARY

Techniques for efficient signal classification in digital pre-distortion systems are described. In an example, an apparatus for signal classification in a digital pre-distortion (DPD) system includes a positive frequency path including a first half-band low pass filter (LPF) operable to filter samples of an input digital samples after positive frequency translation; a negative frequency path including a second half-band LPF operable to filter the samples of the input digital samples after negative frequency translation; a power estimation circuit coupled to the positive frequency path and the negative frequency path, the power estimation circuit operable to determine a first average power based on output of the first half-band LPF, a second average power based on output of the second half-band LPF, and a total average power of the input digital samples; and a controller operable to determine a frequency content metric from the first average power and the second average power, and to select a set of filter coefficients for the DPD system based on the frequency content metric and the total average power.

In another example, a DPD system includes a DPD filter operable to receive a digital signal; a digital-to-analog converter (DAC) coupled to output of the DPD filter; a power amplifier coupled to output of the DAC; and a signal classifier operable to receive the digital signal and to select a set of filter coefficients for the DPD filter from a plurality of sets of filter coefficients based on total average power of the digital signal and a frequency content metric, the signal classifier configured to determine the frequency content metric based on a first average power of samples derived from the digital signal after positive frequency translation and a second average power of the samples derived from the digital signal after negative frequency translation.

In another example, a method of selecting filter coefficients for a DPD system includes filtering samples of an input digital signal after positive frequency translation and estimating a first average power based on the positive frequency translated filtered samples; filtering the samples of the input digital signal after negative frequency translation and estimating a second average power based on the negative frequency translated filtered samples; determining a total average power of the input digital signal; determining a frequency content metric based on the first average power and the second average power; and selecting a set of filter coefficients from a plurality of sets of filter coefficients based on the total average power and the frequency content metric.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
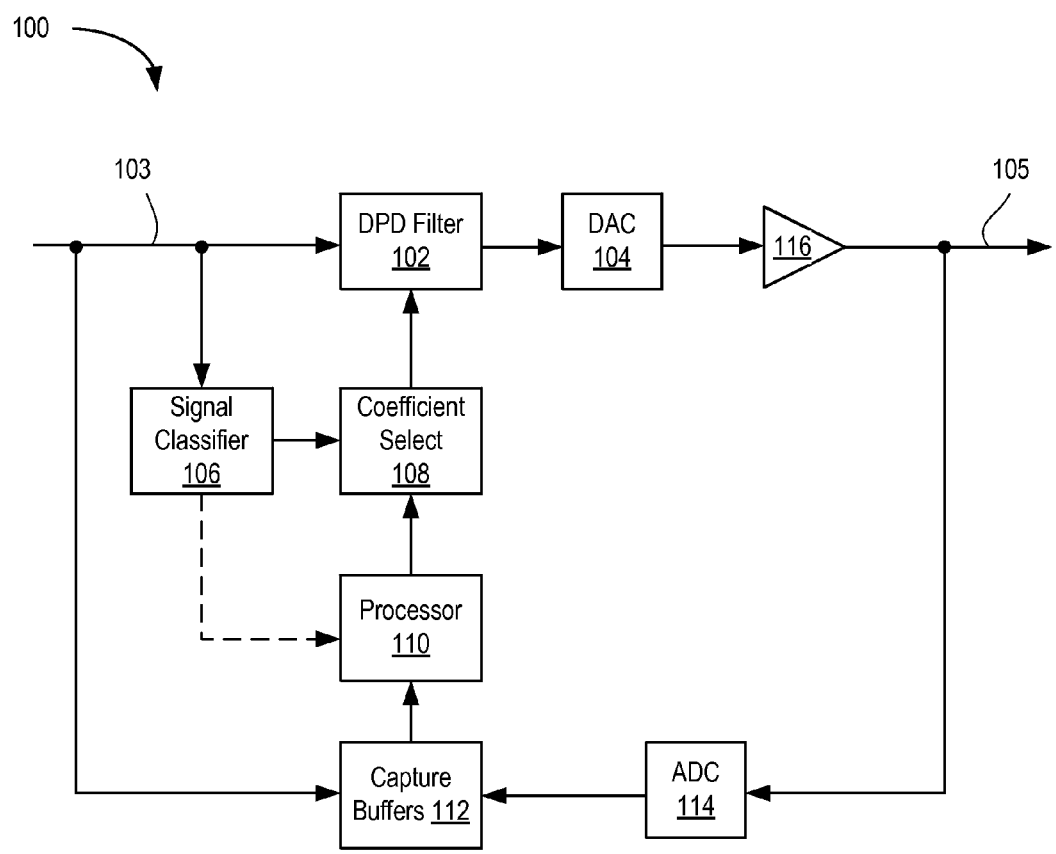
FIG. 1 is a block diagram depicting a digital pre-distortion (DPD) system according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

FIG. 1 is a block diagram depicting a digital pre-distortion (DPD) system 100 according to an example. The DPD system 100 includes a DPD filter 102, a digital-to-analog converter (DAC) 104, a power amplifier 116, a signal classifier 106, a coefficient select circuit 108, a processor 110, capture buffers 112, and an analog-to-digital converter (ADC) 114. An input 103 is operable to receive a digital signal. The digital signal comprises a stream of discrete digital samples (samples). An input of the DPD filter 102 is coupled to the input 103 for receiving the digital signal. An output of the DPD filter 102 is coupled to an input of the DAC 104. An output of the DAC 104 is coupled to an input of the power amplifier 116. An output of the power amplifier 116 is coupled to an output 105 that provides an analog signal as output.

An input of the signal classifier 106 is coupled to the input 103 for receiving the digital signal. In an example, an output of the signal classifier 106 is coupled to a coefficient select circuit 108. An output of the coefficient select circuit 108 is coupled to another input of the DPD filter 102. In another example, an output of the signal classifier 106 is coupled to an input of the processor 110.

One input of the capture buffers 112 is coupled to the input 103, and another input of the capture buffers 112 is coupled to an output of the ADC 114. An input of the ADC 114 is coupled to the output 105 for receiving the analog signal. An output of the capture buffers 112 is coupled to an input of the processor 110. An output of the processor 110 is coupled to another input of the coefficient select circuit 108.

In operation, the DPD filter 102 is configured with a set of filter coefficients. The DPD filter 102 applies digital pre-distortion to the digital signal at the input 103. Any known filter capable of providing digital pre-distortion can be used to implement DPD filter 102. The DAC 104 converts the digital output of the DPD filter 102 to analog output, which is amplified by the power amplifier 116. The processor 110 is configured to analyze the digital signal at the input and samples of the analog signal at the output 105. The processor 110 can obtain samples of the input and output signals from the capture buffers 112. The ADC 114 is configured to sample the analog signal and store the samples in the capture buffers 112 for analysis by the processor 110. The processor 110 can use any known algorithm for generating and updating sets of coefficients that can be used by DPD filter 102 for digital pre-distortion.

The coefficient select circuit 108 can store sets of filter coefficients for the DPD filter 102. The signal classifier 106 is configured to analyze the digital signal and control the coefficient select circuit 108 to select a particular set of coefficients for the DPD filter 102 that is optimal for the digital signal. In another example, rather than directing controlling the coefficient select circuit 108, the signal classifier 106 can provide output to the processor 110, which then controls the coefficient select circuit 108 to select a particular set of filter coefficients based on the output of the signal classifier 106. As discussed further below, the signal classifier 106 selects a set of filter coefficients for use by DPD filter 102 based on total average power of the digital signal and a frequency content metric. The signal classifier 106 does not depend on any particular method that the processor 110 uses to determine the sets of filter coefficients from which to select.

Figure 2:
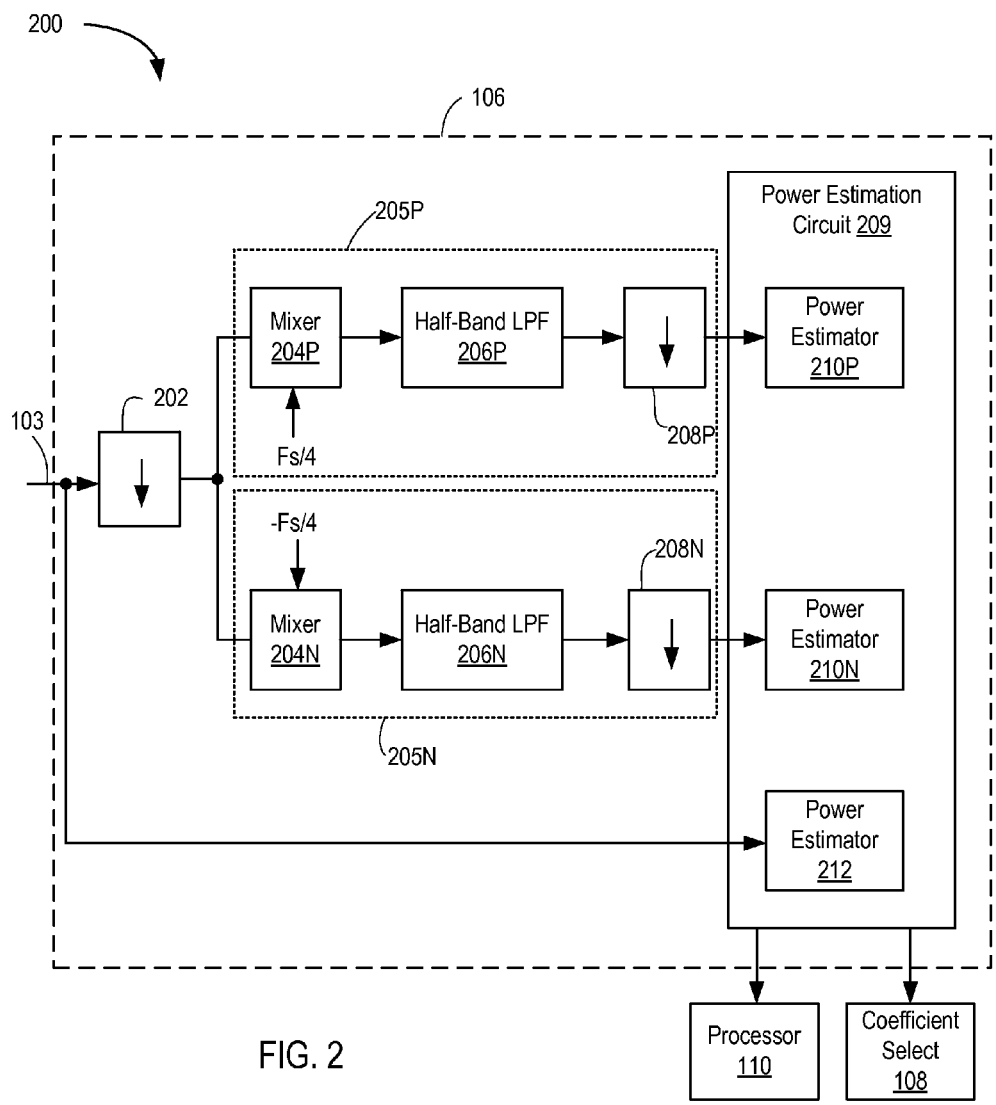
FIG. 2 is a block diagram depicting an example of a signal classification system for a DPD system.

FIG. 2 is a block diagram depicting an example of a signal classification system 200 for a DPD system. The signal classification system 200 includes the signal classifier 106 coupled to the coefficient select circuit 108 and, optionally, the processor 110. The signal classifier 106 includes a positive frequency path 205P, a negative frequency path 205N, and a power estimation circuit 209. The positive frequency path 205P and the negative frequency path 205N comprise a first circuit stage 205. In the signal classification system 200, only a single circuit stage 205 is employed. In other examples discussed below, multiple circuit stages 205 can be employed. In an example, the signal classifier 106 includes a decimator 202 coupled between the input 103 and the positive and negative frequency paths 205P and 205N. The decimator 202 can be used to reduce the sample rate of the digital signal for processing by the positive and negative frequency paths 205P and 205N. For example, the decimator 202 can reduce the sample rate of the digital signal by a factor of four, although other reduction factors can be used. In another example, the decimator 202 can be omitted.

The positive frequency path 205P includes a mixer 204P, a half-band low pass filter (LPF) 206P, and a decimator 208P. The negative frequency path 205N includes a mixer 204N, a half-band LPF 206N, and a decimator 208N. Outputs of the positive frequency path 205P and the negative frequency path 205N are coupled to inputs of the power estimation circuit 209. The power estimation circuit 209 can include a power estimator 210P coupled to an output of the positive frequency path 205P, and a power estimator 210N coupled to an output of the negative frequency path 205N. In an example, the power estimation circuit 209 can include a power estimator 212 coupled to the input 203 for receiving the digital signal. In another example, the power estimator 212 can be coupled to the output of the decimator 202, rather than directly to the input 103. In another example, the power estimator 212 can be omitted, as discussed below.

In operation, the mixer 204P frequency translates the input digital samples using a positive frequency (positive frequency translation), and the mixer 204N frequency translates the input digital samples using a negative frequency (negative frequency translation). The mixer 204P can mix the input digital samples with a local oscillator signal having a frequency that is ¼ the sampling frequency (Fs) (e.g., a sequence $\exp(+j*2*pi/4*t)=1+j0, 0+j, -1+j0, 0-j$, etc.). The mixer 204N can mix the input digital samples with a local oscillator signal having a negative frequency that is ¼ the sampling frequency (Fs) (e.g., a sequence $\exp(-j*2*pi/4*t) =1+j0, 0-j, -1+j0, 0+j$, etc.). As such, the half-band LPFs 206P and 206N operate at to the same sample rate as the mixers 204P and 204N. The half-band LPF 206P passes a lower half of the spectrum of the output of the mixer 204P, which corresponds to the negative frequencies at the input to the mixer 204P. The half-band LPF 206N passes a lower half of the spectrum of the output of the mixer 204N, which corresponds to the positive frequencies at the input to the mixer 204N. The half-band LPFs 206P and 206N can be implemented using finite impulse response filter(s), infinite impulse response filter(s), or the like. In an example, the half-band LPFs 206P and 206N can be implemented using one or more digital signal processors (DSPs).

Figure 7:
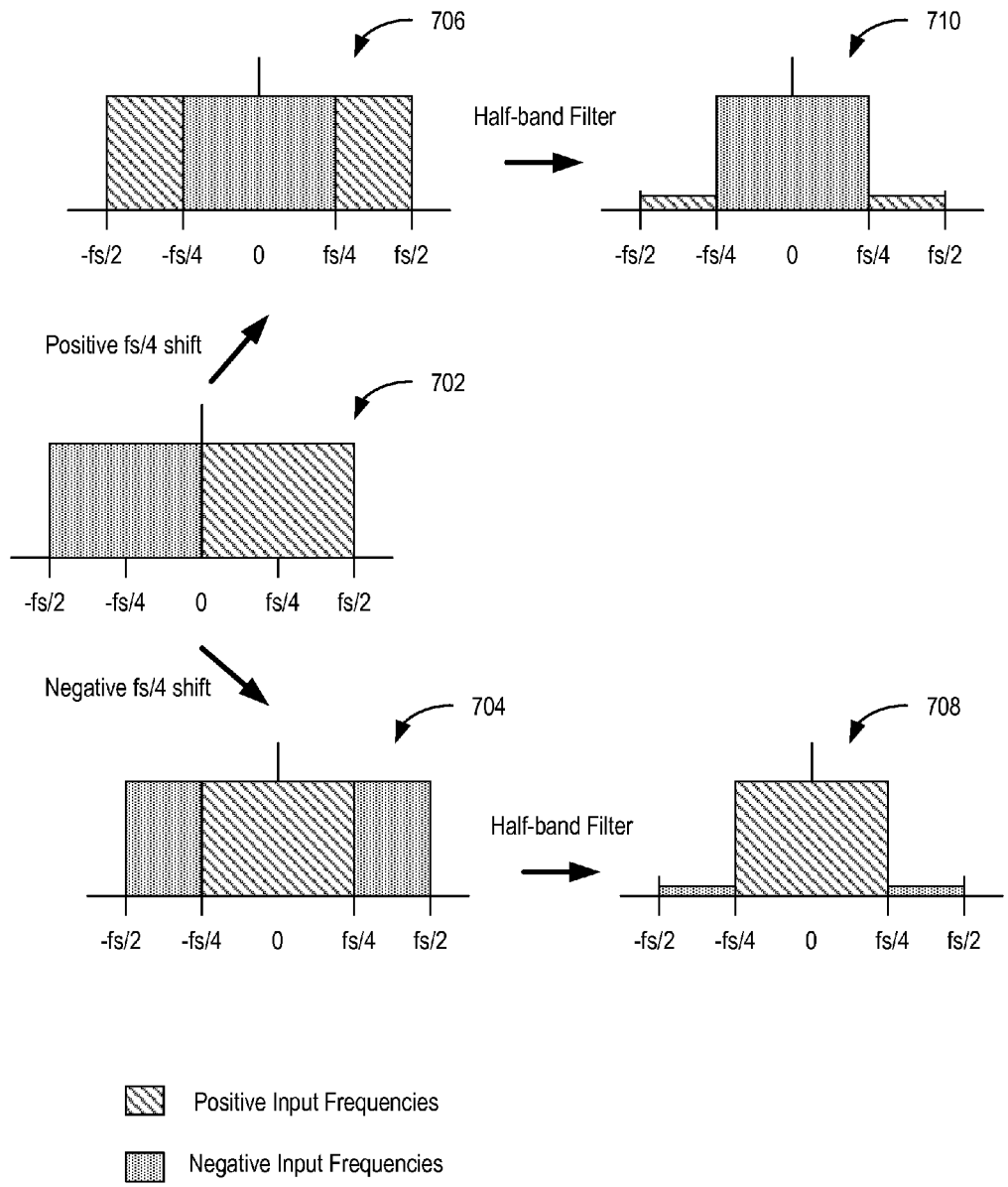
FIG. 7 illustrates signal spectra at different points in the signal classification system 200.

FIG. 7 illustrates signal spectra at different points in the signal classification system 200. A graph 702 shows the spectrum of the input to each of the mixers 204P and 204N. A graph 704 shows the spectrum of the output of the mixer 204N after negative frequency translation. A graph 706 shows the spectrum of the output of the mixer 204P after positive frequency translation. A graph 708 shows the spectrum of the output of the half-band LPF 206N. A graph 710 shows the spectrum of the output of the half-band LPF 206P. As shown, the output of the half-band LPF 206N includes the positive frequencies of the input spectrum in graph 702 centered at zero and ranging between −fs/4 and fs/4. The output of the half-band LPF 206P includes the negative frequencies of the input spectrum in graph 702 centered at zero and ranging between −fs/4 and fs/4.

Returning to FIG. 2, the decimator 208P reduces the sample rate of the output of the half-band LPF 206P, and the decimator 208N reduces the sample rate of the output of the half-band LPF 206N. The decimators 208P and 208N can be used to reduce the sample rate for processing by the power estimation circuit 209. In an example, the decimators 208P and 208N reduce the sample rate by a factor of two, although a reduction by other factors can be used.

The power estimator 210P determines an average power of the output of the positive frequency path 205P ("first average power"), and the power estimator 210N determines an average power of the output of the negative frequency path 205N ("second average power"). The power estimators 210P and 210N can generate average power values for each set of samples output by the positive and negative frequency paths 205P and 205N, where each set of samples comprises one or more samples. The power estimation circuit 209 determines a frequency content metric based on the first and second average power values from the positive and negative frequency paths 205P and 205N, respectively. In an example, the frequency content metric comprises a ratio of the difference between the first average power and the second average power, and the sum of the first average power and the second average power. Such a metric is referred to herein as the half-band power ratio (HBPR). The power estimation circuit 209 can generate values of the HBPR as samples are output by the positive frequency path 205P and negative frequency path 205N.

In an example, the power estimator 212 determines a total average power of the digital signal (either at the full sample rate or decimated by decimator 202). In another example, the power estimation circuit 209 can determine the total average power from the first average power and the second average power. As such, in some examples, the power estimator 212 can be omitted.

The power estimation circuit 209 outputs values for the HBPR and the total average power to the coefficient select circuit 108. In an example, the power estimation circuit 209 can output values for the HBPR and the total average power to the processor 110. In another example, the power estimation circuit 209 can output values for the HBPR and the total average power to both the coefficient select circuit 108 and the processor 110. In any case, the HBPR and total average power values can be used by the coefficient select circuit 108 to select a set of filter coefficients for the DPD filter 102.

Figure 3:
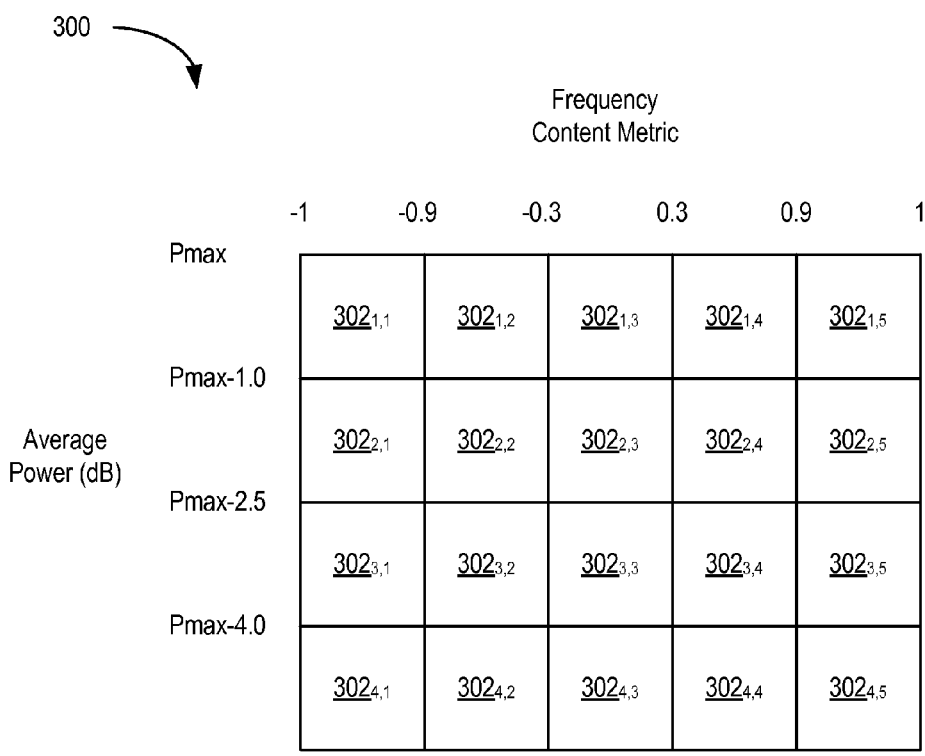
FIG. 3 is a block diagram illustrating an example filter coefficient table.

FIG. 3 is a block diagram illustrating an example filter coefficient table 300. The filter coefficient table 300 includes a horizontal axis representing values of a frequency content metric (FCM), and a vertical axis representing values of average power in decibels (dB). The filter coefficient table 300 includes sets 302 of filter coefficients. In the example, for each row X, the filter coefficient table 300 includes a set $302_{X,1}$ for an FCM value between −1 and 0.9, a set $302_{X,2}$ for an FCM value between −0.9 and −0.3, a set $302_{X,3}$ for an FCM value between −0.3 and 0.3, a set $302_{X,4}$ for an FCM value between 0.3 and 0.9, and a set $302_{X,5}$ for an FCM value between 0.9 and 1. In the example, for each column Y, the filter coefficient table 300 includes a set $302_{1,Y}$ for an average power value between Pmax and Pmax-1.0 dB, a set $302_{2,Y}$ for an average power value between Pmax-1.0 and Pmax-2.5 dB, a set $302_{3,Y}$ for an average power value between Pmax-2.5 and Pmax-4.0 dB, and a set $302_{4,Y}$ for an average power value below Pmax-4.0 dB. The filter coefficient table 300 can include more or less rows for more or less average power values, and/or more or less columns for more or less FCM values. The FCM values (e.g., HBPR values) and total average power values output by the signal classifier 106 can be used as an index for the filter coefficient table 300 to select a set 302 of filter coefficients for the DPD filter 102. As the average power and/or FCM values change, new filter coefficients are selected for the DPD filter 102 in order to maintain optimal or near optimal digital pre-distortion.

Figure 4:
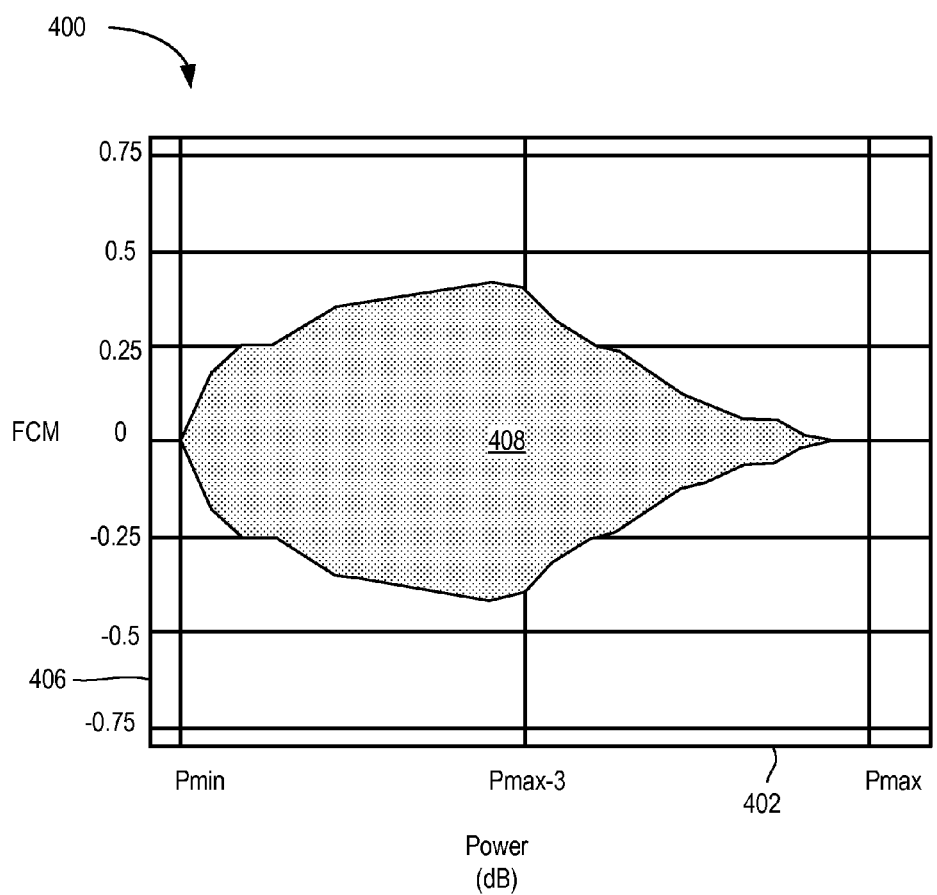
FIG. 4 is a graph relating the frequency content metric and power in an example.

FIG. 4 is a graph 400 relating the frequency content metric and power in an example. The graph 400 includes an axis 402 representing power in decibels (dB), and an axis 406 representing FCM values. The graph 400 corresponds to a response of the signal classifier 106 given two active carriers, where each carrier varies between Pmax and Pmin. As is the difference between Pmax and Pmin increases, the frequency can take on a wider range of values as shown by the area 408 (e.g., the maximum FCM increases). The signal classification system 200 can select new sets of filter coefficients for the DPD filter 102 as the power varies, and new values of the FCM are generated.

Figure 5:
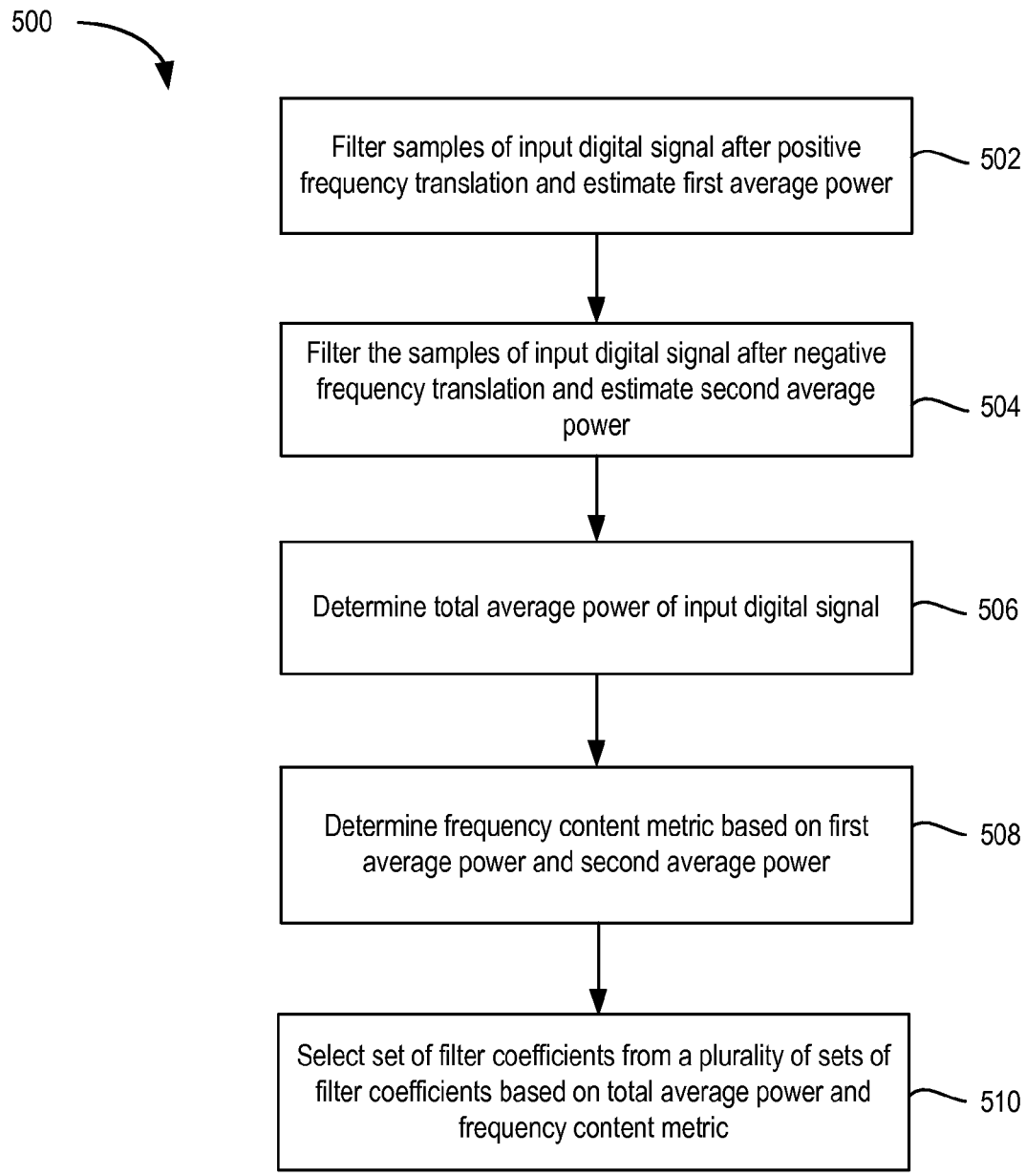
FIG. 5 is a flow diagram depicting a method of selecting filter coefficients for a DPD system according to an example.

FIG. 5 is a flow diagram depicting a method 500 of selecting filter coefficients for a DPD system according to an example. The method 500 can be performed by the signal classification system 200 shown in FIG. 2. The method 500 begins at block 502, where the signal classifier 106 filters samples of an input digital signal after positive frequency translation and estimates a first average power based on the positive frequency translated filtered samples (e.g., the first average power determined by the power estimator 210P). At block 504, the signal classifier 106 filters the samples of the input digital signal after negative frequency translation and estimates a second average power based on the negative frequency translated filtered samples (e.g., the second average power determined by the power estimator 210N). At block 506, the signal classifier 106 determines a total average power of the input digital signal. At block 508, the signal classifier 106 determines a frequency content metric based on the first average power and the second average power. At block 510, signal classification system 200 selects a set of filter coefficients from a plurality of sets of filter coefficients based on the total average power and the frequency content metric. In an example, as discussed above, the input digital signal can be decimated prior to filtering. In an example, as discussed above, the filtered samples can be further decimated prior to estimating power.

Figure 8:
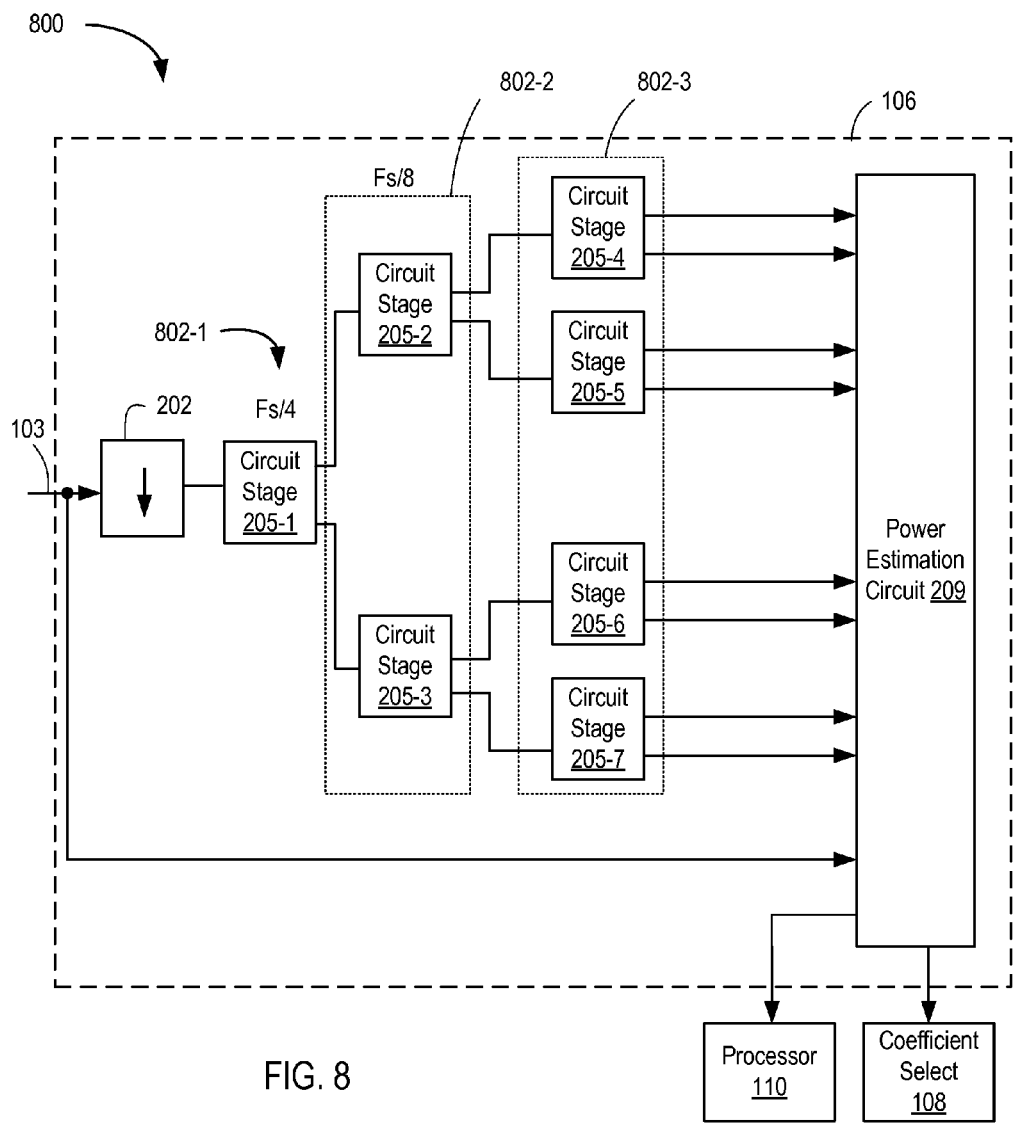
FIG. 8 is a block diagram depicting another example of a signal classification system for a DPD system.

FIG. 8 is a block diagram depicting an example of a signal classification system 800 for a DPD system. Elements in the signal classification system 800 that are the same or similar to those shown in FIG. 2 are designated with identical reference numerals and are described above. In the present example, three iterations 802-1, 802-2, and 802-3 of the circuit stages 205 are used in place of a single stage as shown in FIG. 2. The first iteration 802-1 includes a first circuit stage 205-1, which is coupled to the decimator 202 and can be configured as shown in FIG. 2. The first circuit stage 205-1 operates at ¼ the sampling frequency (Fs). The output of the positive frequency path 205P of the circuit stage 205-1 is coupled to an input of a circuit stage 205-2, and the output of the negative frequency path 205N of the circuit stage 205-1 is coupled to an input of a circuit stage 205-3.

The circuit stages 205-2 and 205-3 comprise the second iteration 802-2. The circuit stages 205-2 and 205-3 operate at ⅛ the sampling frequency (Fs). The output of the positive frequency path 205P of the circuit stage 205-2 is coupled to an input of a circuit stage 205-4, and the output of the negative frequency path 205N of the circuit stage 205-2 is coupled to an input of a circuit stage 205-5. The output of the positive frequency path 205P of the circuit stage 205-3 is coupled to an input of a circuit stage 205-6, and the output of the negative frequency path 205N of the circuit stage 205-3 is coupled to an input of a circuit stage 205-7.

The circuit stages 205-4 through 205-7 comprise the third iteration 802-3. The circuit stages 205-4 through 205-7 operate at 1/16 the sampling frequency (Fs). The outputs of the positive and negative paths 205P and 205N in each of the circuit stages 205-4 through 205-7 are coupled to the power estimation circuit 209. The power estimation circuit 209 determines an average power of the positive and negative frequency paths for each of the circuit stages 205-4 through 205-7 and generates average power values for each set of samples. The power estimation circuit 209 determines frequency content metrics based on the determined average power values. For example, the power estimation circuit 209 can compute an individual HBPR for each of the circuit stages 205-4 through 205-7. The power estimation circuit 209 can combine the individual HBPR values for each of the circuit stages 205-4 through 205-7 to determine an HBPR. The power estimation circuit 209 outputs the values for the HBPR and the total average power to the coefficient select circuit 108, which operates as described above.

In the example of FIG. 3, three iterations 802-1 through 802-3 are used. However, in general, any number of iterations can be used. More iterations of the circuit stages 205 improve the achievable frequency resolution. While the stages double after each iteration, the sampling frequency halves.

Figure 6:
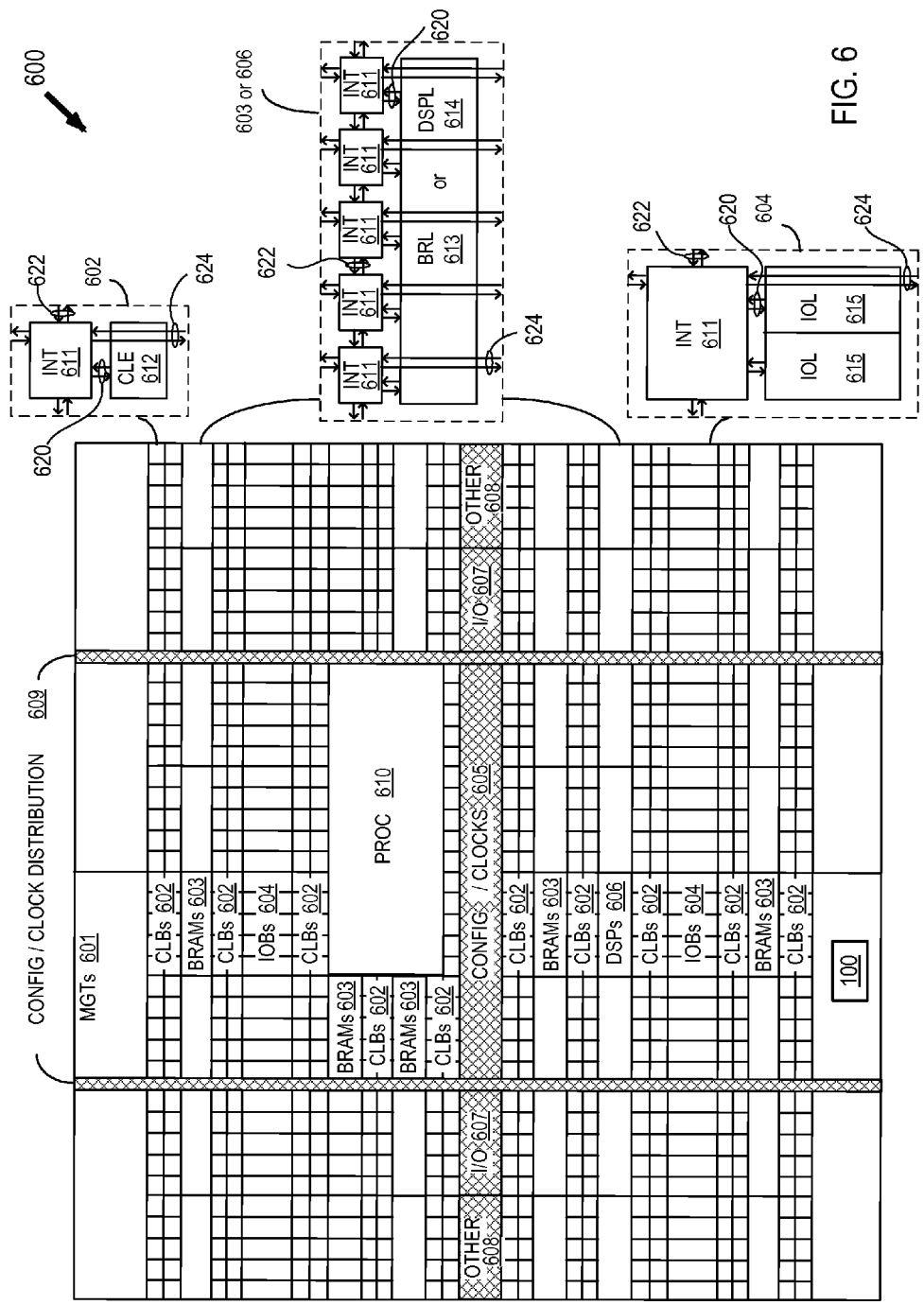
FIG. 6 illustrates a field programmable gate array (FPGA) architecture in which the DPD system of FIG. 1 can be used.

The DPD system 100 described herein can be used in an IC, such as an FPGA. FIG. 6 illustrates an FPGA architecture 600 that includes a large number of different programmable tiles including multi-gigabit transceivers ("MGTs") 601, configurable logic blocks ("CLBs") 602, random access memory blocks ("BRAMs") 603, input/output blocks ("IOBs") 604, configuration and clocking logic ("CONFIG/CLOCKS") 605, digital signal processing blocks ("DSPs") 606, specialized input/output blocks ("I/O") 607 (e.g., configuration ports and clock ports), and other programmable logic 608 such as digital clock managers, analog-to-digital converters, system monitoring logic, and so forth. Some FPGAs also include dedicated processor blocks ("PROC") 610.

In some FPGAs, each programmable tile can include at least one programmable interconnect element ("INT") 611 having connections to input and output terminals 620 of a programmable logic element within the same tile, as shown by examples included at the top of FIG. 6. Each programmable interconnect element 611 can also include connections to interconnect segments 622 of adjacent programmable interconnect element(s) in the same tile or other tile(s). Each programmable interconnect element 611 can also include connections to interconnect segments 624 of general routing resources between logic blocks (not shown). The general routing resources can include routing channels between logic blocks (not shown) comprising tracks of interconnect segments (e.g., interconnect segments 624) and switch blocks (not shown) for connecting interconnect segments. The interconnect segments of the general routing resources (e.g., interconnect segments 624) can span one or more logic blocks. The programmable interconnect elements 611 taken together with the general routing resources implement a programmable interconnect structure ("programmable interconnect") for the illustrated FPGA.

In an example implementation, a CLB 602 can include a configurable logic element ("CLE") 612 that can be programmed to implement user logic plus a single programmable interconnect element ("INT") 611. A BRAM 603 can include a BRAM logic element ("BRL") 613 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 606 can include a DSP logic element ("DSPL") 614 in addition to an appropriate number of programmable interconnect elements. An IOB 604 can include, for example, two instances of an input/output logic element ("IOL") 615 in addition to one instance of the programmable interconnect element 611. As will be clear to those of skill in the art, the actual I/O pads connected, for example, to the I/O logic element 615 typically are not confined to the area of the input/output logic element 615.

In the pictured example, a horizontal area near the center of the die (shown in FIG. 6) is used for configuration, clock, and other control logic. Vertical columns 609 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, processor block 610 spans several columns of CLBs and BRAMs. The processor block 610 can various components ranging from a single microprocessor to a complete programmable processing system of microprocessor(s), memory controllers, peripherals, and the like.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. In an example, the FPGA 600 can include the DPD system 100 and/or the signal classification system 200 or 800 as described above.

While the foregoing is directed to specific examples, other and further examples may be devised without departing from the basic scope thereof, and the scope thereof is determined by the claims that follow.

What is claimed is:

1. An apparatus for signal classification in a digital pre-distortion (DPD) system, comprising:
   a positive frequency path including a first half-band low pass filter (LPF) operable to filter input digital samples after positive frequency translation;
   a negative frequency path including a second half-band LPF operable to filter the input digital samples after negative frequency translation;
   a power estimation circuit coupled to the positive frequency path and the negative frequency path, the power estimation circuit operable to determine a first average power based on output of the first half-band LPF, a second average power based on output of the second half-band LPF, and a total average power of the input digital samples; and
   a controller operable to determine a frequency content metric from the first average power and the second average power, and to select a set of filter coefficients for the DPD system based on the frequency content metric and the total average power.

2. The apparatus of claim 1, further comprising:
   a decimator coupled to the positive frequency path and the negative frequency path to provide the input digital samples, the decimator deriving the input digital samples from an input digital signal.

3. The apparatus of claim 1, wherein the positive frequency path comprises a first mixer having an input configured to receive the input digital samples and an output coupled to the first half-band LPF, and wherein the negative frequency path comprises a second mixer having an input configured to receive the input digital samples and an output coupled to the second half-band LPF.

4. The apparatus of claim 3, wherein the positive frequency path comprises a first decimator having an input coupled to the output of the first half-band LPF and an output coupled to the power estimation circuit, and wherein the negative frequency path comprises a second decimator having an input coupled to the output of the second half-band LPF and an output coupled to the power estimation circuit.

5. The apparatus of claim 1, wherein the power estimation circuit comprises:
a first power estimator operable to generate the first average power; and
a second power estimator operable to generate the second average power.

6. The apparatus of claim 5, wherein the power estimation circuit further comprises:
a third power estimator operable to generate the total average power.

7. The apparatus of claim 5, wherein the power estimation circuit is operable to generate the total average power based on the first average power and the second average power.

8. The apparatus of claim 1, wherein the frequency content metric comprises a ratio of a difference between the first average power and the second average power and a sum of the first average power and the second average power.

9. A digital pre-distortion (DPD) system, comprising:
a DPD filter operable to receive a digital signal;
a digital-to-analog converter (DAC) coupled to output of the DPD filter;
a power amplifier coupled to output of the DAC; and
a signal classifier operable to receive the digital signal and to select a set of filter coefficients for the DPD filter from a plurality of sets of filter coefficients based on total average power of the digital signal and a frequency content metric, the signal classifier configured to determine the frequency content metric based on a first average power of samples derived from the digital signal after positive frequency translation, and a second average power of the samples derived from the digital signal after negative frequency translation.

10. The DPD system of claim 9, wherein the signal classifier comprises:
a positive frequency path including a first half-band low pass filter (LPF) operable to filter the samples;
a negative frequency path including a second half-band LPF operable to filter the samples;
a power estimation circuit coupled to the positive frequency path and the negative frequency path, the power estimation circuit operable to determine the first average power based on output of the first half-band LPF, the second average power based on output of the second half-band LPF, and the total average power; and
a controller operable to determine the frequency content metric from the first average power and the second average power, and to select the set of filter coefficients for the DPD filter based on the frequency content metric and the total average power.

11. The DPD system of claim 10, wherein the positive frequency path comprises a first mixer having an input configured to receive the samples of the digital signal and an output coupled to the first half-band LPF, and wherein the negative frequency path comprises a second mixer having an input configured to receive the samples of the digital signal and an output coupled to the second half-band LPF.

12. The DPD system of claim 11, wherein the positive frequency path comprises a first decimator having an input coupled to the output of the first half-band LPF and an output coupled to the power estimation circuit, and wherein the negative frequency path comprises a second decimator having an input coupled to the output of the second half-band LPF and an output coupled to the power estimation circuit.

13. The DPD system of claim 10, wherein the power estimation circuit comprises:
a first power estimator operable to generate the first average power; and
a second power estimator operable to generate the second average power.

14. The DPD system of claim 13, wherein the power estimation circuit further comprises:
a third power estimator operable to generate the total average power.

15. The DPD system of claim 13, wherein the power estimation circuit is operable to generate the total average power based on the first average power and the second average power.

16. The DPD system of claim 9, wherein the frequency content metric comprises a ratio of a difference between the first average power and the second average power and a sum of the first average power and the second average power.

17. The DPD system of claim 9, wherein the signal classifier comprises:
a plurality of circuit stages arranged in a plurality of iterations, a first iteration of the plurality of iterations including a first circuit stage and each successive iteration of the plurality of iterations including double the number of circuit stages as a previous iteration;
each of the plurality of circuit stages including:
a positive frequency path including a first half-band low pass filter (LPF);
a negative frequency path including a second half-band LPF.

18. A method of selecting filter coefficients for a digital pre-distortion (DPD) system, comprising:
filtering samples of an input digital signal after positive frequency translation and estimating a first average power based on the positive frequency translated filtered samples;
filtering the samples of the input digital signal after negative frequency translation and estimating a second average power based on the negative frequency translated filtered samples;
determining a total average power of the input digital signal;
determining a frequency content metric based on the first average power and the second average power; and
selecting a set of filter coefficients from a plurality of sets of filter coefficients based on the total average power and the frequency content metric.

19. The method of claim 18, wherein the frequency content metric comprises a ratio of a difference between the first average power and the second average power and a sum of the first average power and the second average power.

20. The method of claim 18, further comprising:
decimating the input digital signal prior to the steps of filtering.

* * * * *